United States Patent

Wittmann

[15] 3,651,418

[45] Mar. 21, 1972

[54] SYNCHRONOUS DETECTOR CONTROL

[72] Inventor: Erwin Johann Wittmann, N. Plainfield, N.J.

[73] Assignee: RCA Corporation

[22] Filed: Nov. 16, 1970

[21] Appl. No.: 89,583

[52] U.S. Cl. ..........................329/50, 178/5.4 SD, 307/232, 329/101, 329/192, 330/30 D

[51] Int. Cl. ..........................H03d 3/18

[58] Field of Search ..........................329/101, 103, 50, 192; 328/133, 134; 307/232, 233; 178/5.4 SD; 330/30 D

[56] References Cited

UNITED STATES PATENTS

| | | | |
|---|---|---|---|
| 3,241,078 | 3/1966 | Jones | 329/101 X |
| 3,290,520 | 12/1966 | Wennik | 330/30 D X |
| 3,522,548 | 8/1970 | Heuner et al. | 330/30 D X |
| 3,577,008 | 5/1971 | Craft | 330/30 D X |

*Primary Examiner*—Alfred L. Brody
*Attorney*—Eugene M. Whitacre

[57] ABSTRACT

A synchronous detector includes a differential amplifier section formed from two transistors with input signals applied to their base electrodes and output signals taken from their collector electrodes for application to an included synchronous switching section. A current source section is also included to supply substantially constant quiescent current to each of the transistor emitter electrodes, while a control section is additionally included for diverting some of this current away from the differential amplifier transistors when it is desired to reduce the gain of the detector or inhibit its operation. The electrical control section, however, re-inserts the diverted current into the switching section at a point such that the direct output voltage of the detector does not change as the gain is reduced or as its operation is inhibited.

9 Claims, 4 Drawing Figures

Figure 1:
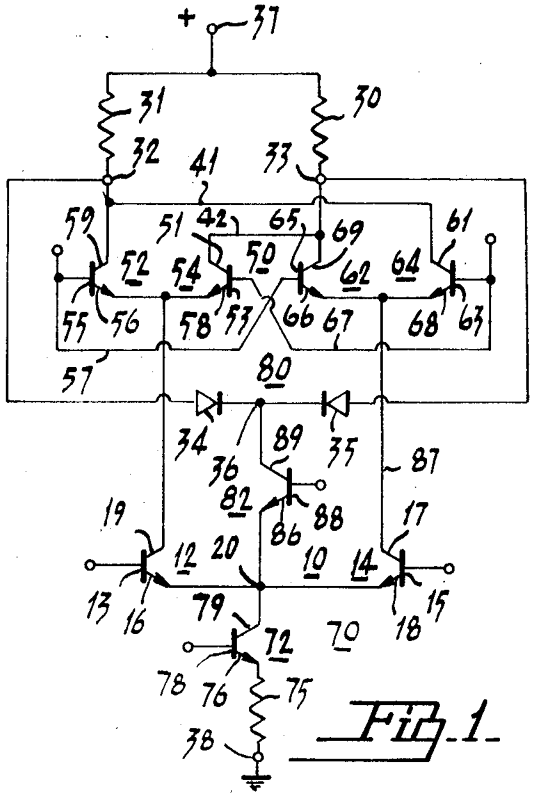

INVENTOR
ERWIN J. WITTMANN
BY
Charles Brodsky
ATTORNEY

SYNCHRONOUS DETECTOR CONTROL

This invention relates to synchronous detectors in general, and to such apparatus as may be gain controllable without upsetting its direct voltage output as the control is effected, in particular.

As will become clear hereinafter, synchronous detectors constructed in accordance with the invention include a differential amplifying section to provide push-pull currents in response to the application of an input signal to be demodulated, and a switching section to which a reference signal is applied to demodulate the differentially amplified output currents. A substantially constant current source supplies quiescent current to the differential section for amplification by the input signal. The switching section provides a current at each of its two output terminals comprising a demodulated signal component corresponding to the information contained in the input signal and a quiescent component establishing the direct voltage output of the detector. In accordance with the invention, a control section is included to divert some of the quiescent current from the differential section to reduce its amplification, but to re-insert it at the detector switching section so as to offset any tendency for the direct voltage output to vary as its quiescent component is reduced.

Three arrangements are disclosed by means of which the demodulated signal component can be gain controlled, without affecting the quiescent component. In one arrangement, push-pull detected signal outputs are taken from the synchronous switching section through first and second output terminals, each connected to a source of energizing potential through load resistors of equal resistance value. A pair of semiconductor rectifiers are connected with like electrodes joined in series connection between the output terminals, while the collector-to-emitter path of a control transistor is serially coupled between the constant current source and the junction of the rectifier devices. By biasing the control transistor well into conduction, the constant current will be diverted significantly away from the differential amplifier transistors with the result that the detector will be substantially disabled as little, if any, input signal will be coupled to its switching section. By supplying the diverted current to the load resistors, however, the quiescent component of the signal developed at the output terminals will be maintained substantially constant even though the signal gain is reduced.

A second arrangement according to the invention uses first and second control transistors, and the detector output terminals may be coupled to energizing potential (or current) sources which may be dissimilar in value, through any direct coupling means. The collector-to-emitter path of each transistor connects a different one of the two detector output terminals to the constant-current source, and each transistor is responsive to control signals applied to their base electrodes to divert a portion of the quiescent current from the differential amplifier section directly to the output terminals of the detector. This arrangement is attractive in that detector gain may be controlled in a continuous manner rather than in an on-or-off manner.

A third arrangement embodying the invention resembles the second arrangement in using two control transistors to secure control of detector gain in a continuous manner, but their collector-to-emitter paths are arranged to connect the diverted quiescent current to the outputs of the differential amplifier section rather than to the outputs of the switching section. This construction is desirable because any inaccuracy in the equal diversion of current through the two control transistors is divided between the detector outputs in the same fashion as any inaccuracy in the equal division of quiescent current through the differential amplifier transistors. Such diversion of the unbalanced currents from the differential amplifier transistors by the control transistors will thus not affect the quiescent current component in the detector output.

Figure 2:
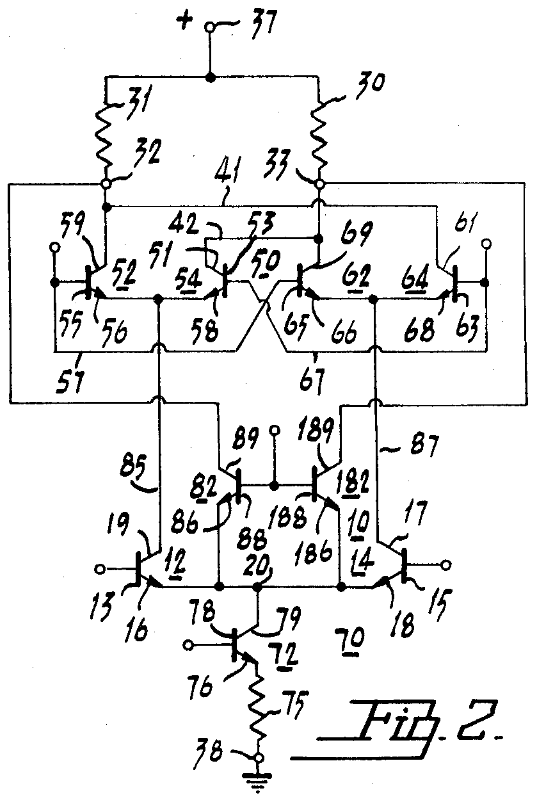
Figure 3:
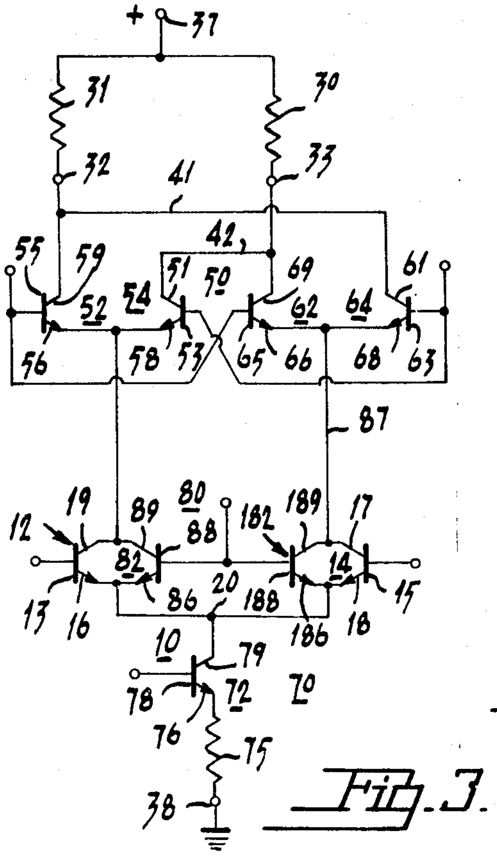
Figure 4:
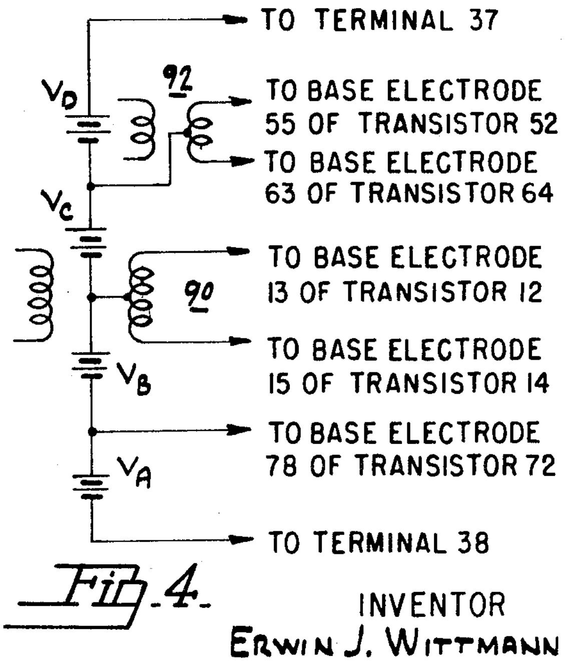

While synchronous detectors of the type described are quite useful as the difference detector in a sterophonic sound system, they are particularly attractive for use as the Q-axis chroma demodulator of a color television receiver. Since the Q-axis chroma demodulator couples the "blue" or "green" signals to the color kinescope, such gain reduction in the presence of an I or flesh signal reduces any "green" or "blue" shading that might exist. At the same time, proper color background is maintained in the reproduced picture by stabilizing the direct voltage coupled from the demodulator to the appropriate control electrodes of the color picture to These and other advantages of the invention will become clear from the following description taken in connection with the accompanying drawings in which:

FIGS. 1–3 show embodiments of synchronous detector circuits constructed in accordance with the present invention; and FIG. 4 shows an equivalent representation of a bias and input signal network useful with the circuits of FIGS. 1–3.

Referring now to FIG. 1, the synchronous detector there shown includes a differential amplifier section 10, a switching section 50, a constant current source section 70 and a control section 80. As shown, the differential amplifier section 10 includes a pair of transistors 12, 14, the emitter electrodes 16, 18 of which are interconnected at a junction point 20. The differential amplifier section is arranged to have input signals to be demodulated applied between the base electrodes 13. 15 of transistors 12, 14 and to provide output signals at the collector electrodes 19, 17 of transistors 12, 14 in response thereto.

The switching section 50 comprises a first pair of transistors 52, 54 having emitter electrodes 56, 58 connected to the collector electrode 19 of transistor 12 and a second pair of transistors 62, 64 having emitter electrodes 66, 68 connected to the collector electrode 17 of transistor 14. The base electrodes 55, 65 of transistors 52, 62 are interconnected, as are the corresponding base electrodes 53, 63 of transistors 54, 64 while the collector electrode 59 of transistor 52 is interconnected by lead 41 to the collector electrode 61 of transistor 64, and the collector electrode 51 of transistor 54 is interconnected by lead 42 to the collector electrode 69 of transistor 62. The collector electrode 59 of transistor 52 is connected to a detector output terminal 32 and coupled by a resistor 31 to an energizing potential terminal 37. The collector electrode 69 of transistor 62 is connected to a detector output terminal 33 and coupled by a resistor 30 to the energizing potential terminal 37.

The constant current source 70 is shown as including a transistor 72 having an emitter electrode 76 coupled to a point of reference or ground potential 38 by a stabilizing resistor 75. The collector electrode 79 of transistor 72 is coupled to the junction point 20 between the differential amplifier emitter electrodes 16, 18. The base electrode 78 of transistor 72 is connected to a source of fixed bias potential (not shown).

The control section 80 is shown as comprising two semiconductor rectifiers 34, 35 having two of their like electrodes connected at a point 36 and a control transistor 82 having its collector-to-emitter path connecting points 20, 36. The other two electrodes of semi-conductor rectifiers 34, 35, which are not connected together, are connected respectively to detector output terminals 32, 33. The control transistor 82 is shown as an NPN type with emitter electrode 86 connected to point 20 and a collector electrode 89 connected to point 36, while the cathode electrodes of semiconductor rectifiers 34, 35 are connected together at point 36. The base electrode 88 of transistor 82 is connected to a source of control signals (not shown) for selectively varying the gain of the detector.

Such arrangement as described can be fabricated using integrated circuit techniques as the resistor, transistor and rectifier components can be easily constructed on a monolithic chip. Individual ones of terminals 32, 33, 37 and 38–as well as of those terminals connected to the base electrodes of transistors 12, 14, 52, 64, 72, and 82—may then represent available terminals around the periphery of the device for connecting various components of the chip to appropriate input, output and biasing networks for the synchronous detector. Such connections may be as equivalently illustrated in FIG. 4, where $V_A$, $V_B$, $V_C$, and $V_D$ represent positive energizing potentials to be respectively used in biasing the constant current source 70, the differential amplifier 10, and the switching section 50, as well as to provide the operating B+ potential for the detector—and where the battery sources might represent integratable potential supplies known to those skilled in the art. A first transformer 90 may serve to couple the input signals to be detected to the base electrodes 13, 15 of the differential amplifier transistors 12, 14, while a second transformer 92 may serve to couple the synchronous reference signals to the base electrodes 55, 63 of the switching transistors 52, 64. Such connections may be employed equally as well with the detector arrangements of FIGS. 2 and 3 where identical reference notations are used to identify corresponding parts as in the configuration of FIG. 1. These interconnections, however, will be understood to be illustrative only and not a limiting construction for the detectors described herein.

The arrangement of FIG. 1 illustrates a full-wave detector for demodulating input signals which are sidebands of a carrier having the same frequency as the reference switching signal. The reference signal switches transistors 52 and 62 "ON" at the same time because lead 57 connects their base electrodes 55, 65 together. The differential actions of their respective circuits and the push-pull nature of the applied signal thus turn transistors 54 and 64 to their "OFF" conditions simultaneously, the base electrode 53 of transistor 54 being held at the same direct potential as the base electrode 63 of transistor 64 by connection through the lead 67. For the polarity shown in the drawing, such operations would occur when the reference switching signal drives base electrodes 55, 65 more positive than base electrodes 53. 63. Conversely, where the signal application drives the base electrodes 55, 65 more negative than base electrodes 53, 63, transistors 52 and 62 turn "OFF" and transistors 54 and 64 turn "ON." In this respect it will be noted that one transistor of each of the switching pairs is connected to a corresponding transistor in the other pair.

In like manner, a positive-going input signal applied to base electrode 13 of transistor 12 turns that transistor towards its "ON" condition, and causes transistor 14 to turn towards its "OFF" state. On the other hand, when the input signal applied to base electrode 13 is negative-going, transistor 12 is turned towards its "OFF" direction while transistor 14 is turned towards its "ON" condition.

With the reference switching signal and the input signal assumed to be of the same phase and polarity, positive-going application of the input signal to transistor 12 then turns that transistor towards an "ON" condition, permitting the quiescent current from transistor 72 to flow through transistors 12 and 52 to output terminal 32. The action of transistor 14 turning towards its "OFF" condition due to the differential connection and push-pull applied input signal reduces the current flow from transistor 72 through transistors 14 and 62 to output terminal 33 even though transistor 62 is switched to its "ON" condition by the positive-going reference signal. On the next half cycle of the input signal, transistor 12 is turned towards its "OFF" state while transistor 14 is turned towards its "ON" condition. Such turning "OFF" of transistor 12 reduces the current flow from transistor 72 to output terminal 33 although transistor 54 is rendered conductive by the negative-going half cycle of the reference signal. In like manner, the turning of transistor 14 towards its "ON" condition by the applied input signal permits the quiescent current to flow from transistor 72 to output terminal 32 through the then switched "ON" transistor 64.

It will thus be seen that, on both half cycles of a given phase angle input signal, output terminal 32 receives current translations of differential transistors 12 and 14 going towards their "ON" conditions so as to develop negative-going signal component swings across load resistor 31. Conversely, output terminal 33 receives current translations of transistors 12 and 14 going towards their "OFF" conditions to develop positive-going signal component swings across load resistor 30. It will be evident that for the case where the synchronously applied switching signals and the input signals are 180° out of phase with one another, the reverse will occur and positive-going signals will be developed at terminal 32 while negative-going signal component swings will be developed at terminal 33.

The arrangement as so far described constitutes a way in which the quiescent current from transistor 72 is directed to the detector outputs in response to the relative timing of the reference switching signal with respect to the detector input signals and to the amplitude of the detector input signals, the input signals being those applied between the base electrodes of transistors 12 and 14. Larger amplitude input signal will thus produce greater signal swings across load resistors 30 and 31 than will smaller amplitude signals. Synchronous detectors of the type described may be used in a wide variety of applications—as the difference detector in sterophonic sound systems and as a chrominance detector in a color television receiver, for example.

In FIG. 1, and in the absence of applied input signals, the quiescent currents from the collector electrodes 19, 17 of transistor 12, 14 are each switched to the detector output terminals 32, 33 for a half cycle of the push-pull applied reference switching frequencies, so equal halves of the quiescent current from source section 70 appear in each of the detector outputs. Application of a positive control signal to the base electrode 88 of transistor 82 to heavily forward-bias its base-emitter junction places it into conduction to divert the quiescent current that would normally flow through the differential transistors 12 and 14 (when conductive) away from those transistors. This significant reduction of current flow in transistors 12 and 14 will substantially reduce their transconductance and thus the gain of the differential amplifier configuration to applied signals. There will also be a tendency for the quiescent current component at the detector output terminals to be reduced, which would cause the direct voltage at each of the detector outputs to change towards the energizing potential at terminal 37. This tendency for the direct voltage to change is counteracted, however, by splitting the current diverted by the control transistor 82 into equal halves, and by applying each half to an output of the detector. This split is effected by the similar impedance paths provided by the series combination of resistor 31 and semiconductor rectifier 34 and by the series combination of resistor 30 and semiconductor rectifier 35. Since the heavy conduction of the control transistor 82 will forward-bias the semiconductor rectifiers to connect the detector outputs together by a low-impedance clamping path, proportional control of detector gain cannot be achieved by the circuitry shown in FIG. 1. The circuitry of FIG. 1 functions well, however, to disable synchronous detector operation.

It was found, however, to be advantageous to externally control the gain of a synchronous detector so as to facilitate its use as the Q demodulator in a color television receiver. There, the demodulator contributes the "green" or "blue" portions of the reproduced scene, and it would be desirable to reduce such contributions when flesh tones appear on the kinescope screen. In addition, it would be desirable if such gain reductions could be effected in a manner such that the direct voltage output of the demodulator would remain substantially constant so as to stabilize the bias on the following chroma driver stages and the resulting bias on the control grid or cathode electrode of the color kinescope. Stabilization of the quiescent output current of detector was required to prevent a shift in the predominant color shading of the picture as a function of gain control which would disturb the proper color balance of the picture.

The arrangement of FIG. 2 is quite similar to that of FIG. 1, but uses a different control section 80. The control section 80 of FIG. 2 comprises a first and a second control transistors 82, 182, with their emitter electrodes 86, 186 each connected to point 20. The first control transistor 82 has its collector electrode 89 coupled to the collector electrode 59 of transistor 52 while the corresponding electrode 189 of the second control transistor 182 is coupled to the collector electrode 51 of the detector transistor 54. The base electrodes 88, 188 of control transistors 82, 182 are connected together to commonly receive the gain control signal. With this arrangement, gain reduction is effected by increasing the potential at the base electrodes 88, 188 relative to their emitter electrodes 86, 186 such that some of the current that would normally flow through transistors 12 and 14 from the transistor 72 is diverted through now- conductive transistors 82, 182. The transconductance of the transistors 12, 14 will be reduced in accordance with their diminished quiescent current flows, lowering the gain of the differential amplifier they form. The reinsertion of the diverted current, however, occurs at the collector electrodes of transistors 52 and 54 so that the quiescent current flowing in the output circuit of the detector and the resultant direct voltage developed at terminals 32, 33 again are stabilized in the presence of gain reduction. An advantage of using the arrangement of FIG. 2 over that of FIG. 1 is that it becomes unnecessary to equalize the impedances in each half of the detector as seen from terminal 36 in FIG. 1 in order to obtain identical current splitting. This is useful where single ended detector operation is desired, as where only one of the two output terminals 32, 33 are employed in circuit constructions. Another advantage of the arrangement shown in FIG. 2 as compared to that shown in FIG. 1 is that the detector gain may be proportionally controlled.

The arrangement of FIG. 3 is yet another variation of FIG. 1 configuration, and particularly differs from the FIG. 2 construction in that the collector electrode 89 of control transistor 82 is here connected to the collector electrode 19 of transistor 12 while the corresponding collector electrode 189 of transistor 182 is connected to the collector electrode 17 of transistor 14. Gain control is again effected by diverting some of the current from transistor 72 through the transistors 82 and 182 and away from the input transistors 12 and 14, with the diverted current being once again recombined prior to the output terminals of the detector. This arrangement is particularly desirable in that the proper current and direct voltage stabilization will occur at the output terminals 32, 33 even though there be an imbalance in the splitting of current between the collector-to-emitter paths of the transistors 82 and 182. Such unbalance would undesirably produce different quiescent current components at the output terminals 32, 33 in the arrangement of FIG. 2. The arrangement of FIG. 3 is especially attractive once it is realized that the described operation is effective regardless of the form taken by the applied control signal, and whether it be an alternating signal, a pulse signal or a direct signal. The described reinsertion will also be seen effective independent of the individual operations of the differential and switching sections of the detector, which operations would usually have to be considered with the configurations of FIGS. 1 and 2 in order to determine the proper manner of current reinsertion to maintain a constant detector output voltage.

While there have been described what are considered to be preferred embodiments of the invention, it will be readily apparent that modifications may be made by those skilled in the art without departing from the teachings herein. Thus, while transistors have been utilized to illustrate the invention, it will be recognized that other electronic valves may be employed in similar practice of the invention. Alternatively, it will be appreciated that use of NPN transistors in the circuits of the drawing are selected for purposes of illustration only; as conversion to PNP transistors and corresponding circuits are well within the skill of the average technician, it will be seen that such NPN showings are not a limiting feature of the instant disclosure.

What is claimed is:

1. In a synchronous detector including a differential amplifier section formed from two transistors having a pair of base electrodes between which information containing input signals are applied, a pair of collector electrodes at which corresponding intermediate signals are developed for coupling to a synchronous switching section also included within the detector to provide demodulated output signals representative of said information, and a pair of emitter electrodes coupled to a current source section further included within the detector to supply substantially constant quiescent current to said amplifier section and from said amplifier section to said switching section, the improvement comprising:

means controllably reducing the magnitude of the demodulated output signal provided by said synchronous switching section without substantially affecting the magnitude of the direct voltage developed thereat, said means including:

a. a first terminal coupled to said current source section;

b. a second terminal coupled to said synchronous switching section; and c. a third terminal coupled to receive an externally applied signal for controlling the conductivity between said first and second terminals to divert quiescent current flow from said current source section through said means and away from said differential amplifier section to desirably reduce the magnitude of the intermediate signals developed by said amplifier section and the magnitude of the demodulated output signal provided by said synchronous switching section, but having a tendency to reduce the magnitude of the quiescent current supplied from said amplifier section to said synchronous switching section to undesirably reduce the direct voltage developed thereat;

said second terminal being coupled, however, to receive said diverted quiescent current for subsequent reinsertion within said synchronous switching section with said reduced magnitude quiescent current from said differential amplifier section in a direction to offset said undesirable reduction in direct voltage and to maintain the total quiescent current in said switching section substantially constant in the presence of such signal magnitude reductions.

2. The improvement of claim 1 wherein said second terminal is coupled to reinsert said diverted quiescent current at an output terminal of said synchronous switching section at which the demodulated signals are provided and at which the direct voltage is developed.

3. The improvement of claim 1 wherein said second terminal is coupled to reinsert said diverted quiescent current at an input terminal of said synchronous switching section to which said corresponding intermediate signals are coupled.

4. The improvement of claim 2 wherein said synchronous switching section includes a pair of output terminals at which the demodulated signals are provided and at which the direct voltage is developed, and wherein said second terminal is coupled to each of said output terminals by a network serving to connect said output terminals together in response to said externally applied control signal to reduce towards zero the magnitude of the demodulated signal provided by said switching section.

5. The improvement of claim 4 wherein said means includes a third transistor having an emitter electrode coupled to said current source section, a base electrode coupled to receive said externally applied control signal, and a collector electrode individually coupled to each of said switching section output terminals by a pair of semiconductor rectifiers, and wherein said rectifiers are poled to be forward-biased when said externally applied control signal places said third transistor in a conductive condition.

6. The improvement of claim 2 wherein said synchronous switching section includes a pair of output terminals at which the demodulated signals are provided and at which the direct voltage is developed, wherein said means includes third and fourth transistors individually having an emitter electrode coupled to said current source section and a base electrode coupled to receive said externally applied control signal, and wherein said third transistor additionally has a collector electrode directly connected to one of said pair of output terminals while said fourth transistor also has a collector electrode directly connected to the other of said pair of output terminals.

7. The improvement of claim 3 wherein said synchronous switching section includes a pair of input terminals to which the responsive intermediate signals are coupled, wherein said means includes third and fourth transistors individually having an emitter electrode coupled to said current source section and a base electrode coupled to receive said externally applied control signal, and wherein said third transistor additionally has a collector electrode directly connected to one of said pair of input terminals while said fourth transistor also has a collector electrode directly connected to the other of said pair of input terminals.

8. The improvement of claim 1 wherein said synchronous switching section includes third, fourth, fifth, and sixth transistors, with the emitter electrodes of said third and fourth transistors interconnected with one of said pair of differential amplifier section collector electrodes, with the emitter electrodes of said fifth and sixth transistors interconnected with the other of said pair of differential amplifier section collector electrodes, with the base electrodes of said third and fifth transistors interconnected to receive switching signals for demodulating a first phase of said applied input signals, with the base electrodes of said fourth and sixth transistors interconnected to receive switching signals for demodulating a second phase of said applied input signals, with the collector electrode of said third and sixth transistors interconnected to provide first polarity demodulated signals at a first output terminal of said detector, and with the collector electrodes of said fourth and fifth transistors interconnected to provide second polarity demodulated signals at a second output terminal of said detector, and wherein said means controllably reducing the magnitude of the demodulated output signal without substantially affecting the magnitude of the direct voltage developed at said first and second output terminal includes a seventh transistor having an emitter electrode coupled to said current source section, a base electrode coupled to receive said externally applied control signal, and a collector electrode coupled to one of said first and second output terminals of said detector or to one of said interconnected emitter electrodes of said third, fourth, fifth and sixth transistor.

9. The improvement of claim 8 wherein said current source section includes an eighth transistor having an emitter electrode resistively coupled to a point of reference potential, a base electrode to which a source of energizing potential is applied and a collector electrode through which said substantially constant quiescent current flows, and wherein the emitter electrode of said seventh transistor is directly connected to the collector electrode of said eighth transistor.

* * * * *

REEXAMINATION CERTIFICATE (14th)

United States Patent [19]

[11] B1 3,651,418

Wittmann

[45] Certificate Issued Sep. 7, 1982

[54] SYNCHRONOUS DETECTOR CONTROL

[75] Inventor: Erwin Johann Wittman, North Plainfield, N.J.

[73] Assignee: RCA Corporation, Princeton, N.J.

Reexamination Request

No. 90/000,079, Oct. 2, 1981

Reexamination Certificate for:

Patent No.: 3,651,418
Issued: Mar. 21, 1972
Appl. No.: 89,583
Filed: Nov. 16, 1970

[51] Int. Cl.³ .................. H03D 3/18

[52] U.S. Cl. ...329/50; 179/1GE; 329/101; 329/192; 358/26; 358/29; 455/214

[58] Field of Search .................. 329/50, 101, 103, 192; 455/214, 337; 358/23–27, 29, 40; 179/1GB, 1GC, 1GE; 330/254

[56] References Cited

U.S. PATENT DOCUMENTS

| | | | |
|---|---|---|---|
| 3,513,256 | 5/1970 | Belotti | 358/23 |
| 3,541,466 | 11/1970 | Yee | 330/252 |
| 3,627,915 | 12/1971 | Schellekens et al. | 358/26 |
| 3,707,603 | 12/1972 | Limberg | 179/1GG |

FOREIGN PATENT DOCUMENTS

| | | |
|---|---|---|
| 2009132 | 5/1969 | France. |
| 537202 | 10/1931 | Germany. |
| 1925271 | 11/1969 | Germany. |
| 44-39509 | 10/1971 | Japan. |
| 6807207 | 5/1968 | Netherlands. |
| 1201015 | 8/1970 | United Kingdom. |

OTHER PUBLICATIONS

Dutch Patent Application No. 7018863, Jul. 1, 1971, RCA Corp.

*Primary Examiner*—Siegfried H. Grimm
*Attorney, Agent, or Firm*—Paul J. Rasmussen, Peter M. Emanuel, W. Brinton Yorks, Jr.

[57] ABSTRACT

A synchronous detector includes a differential amplifier section formed from two transistors with input signals applied to their base electrodes and output signals taken from their collector electrodes for application to an included synchronous switching section. A current source section is also included to supply substantially constant quiescent current to each of the transistor emitter electrodes, while a control section is additionally included for diverting some of this current away from the differential amplifier transistors when it is desired to reduce the gain of the detector or inhibit its operation. The electrical control section, however, re-inserts the diverted current into the switching section at a point such that the direct output voltage of the detector does not change as the gain is reduced or as its operation is inhibited.

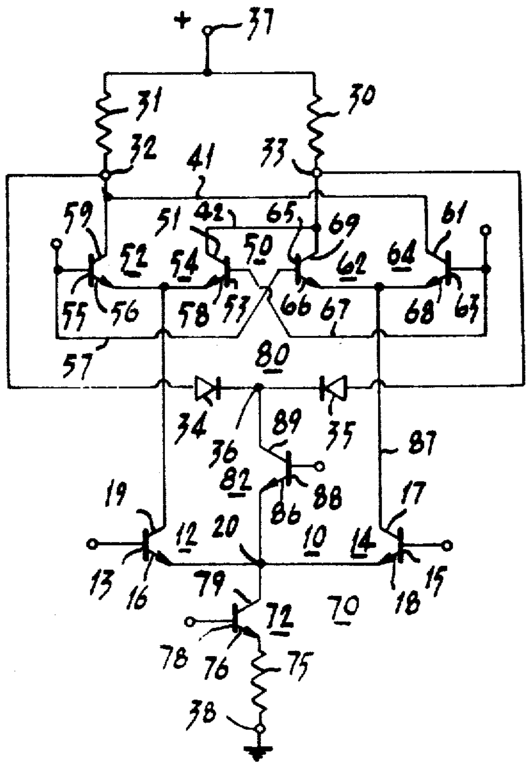

REEXAMINATION CERTIFICATE ISSUED UNDER 35 U.S.C. 307.

THE PATENT IS HEREBY AMENDED AS INDICATED BELOW.

Matter enclosed in heavy brackets appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 2, 4, and 6, having been finally determined to be unpatentable, are cancelled.

Claims 3, 5, and 8 are determined to be patentable, as amended.

3. [The improvement of claim 1] *In a synchronous detector including a differential amplifier section formed from two transistors having a pair of base electrodes between which information containing input signals are applied, a pair of collector electrodes at which corresponding intermediate signals are developed for coupling to a synchronous switching section also included within the detector to provide demodulated output signals representative of said information, and a pair of emitter electrodes coupled to a current source section further included within the detector to supply substantially constant quiescent current to said amplifier section and from said amplifier section to said switching section, the improvement comprising:*

*means controllably reducing the magnitude of the demodulated output signal provided by said synchronous switching section without substantially affecting the magnitude of the direct voltage developed thereat, said means including:*

*a. a first terminal coupled to said current source section;*

*b. a second terminal coupled to said synchronous switching section; and*

*c. a third terminal coupled to receive an externally applied signal for controlling the conductivity between said first and second terminals to divert quiescent current flow from said current source section through said means and away from said differential amplifier section to desirably reduce the magnitude of the intermediate signals developed by said amplifier section and the magnitude of the demodulated output signal provided by said synchronous switching section, but having a tendency to reduce the magnitude of the quiescent current supplied from said amplifier section to said synchronous switching section to undesirably reduce the direct voltage developed thereat;*

*said second terminal being coupled, however, to receive said diverted quiescent current for subsequent reinsertion within said synchronous switching section with said reduced magnitude quiescent current from said differential amplifier section in a direction to offset said undesirable reduction in direct voltage and to maintain the total quiescent current in said switching section substantially constant in the presence of such signal magnitude reductions;* wherein said second terminal is coupled to reinsert said diverted quiescent current at an input terminal of said synchronous switching section to which said corresponding intermediate signals are coupled.

5. [The improvement of claim 4] *In a synchronous detector including a differential amplifier section formed from two transistors having a pair of base electrodes between which information containing input signals are applied, a pair of collector electrodes at which corresponding intermediate signals are developed for coupling to a synchronous switching section also included within the detector to provide demodulated output signals representative of said information, and a pair of emitter electrodes coupled to a current source section further included within the detector to supply substantially constant quiescent current to said amplifier section and from said amplifier section to said switching section, the improvement comprising:*

*means controllably reducing the magnitude of the demodulated output signal provided by said synchronous switching section without substantially affecting the magnitude of the direct voltage developed thereat, said means including:*

*a. a first terminal coupled to said current source section;*

*b. a second terminal coupled to said synchronous switching section; and*

*c. a third terminal coupled to receive an externally applied signal for controlling the conductivity between said first and second terminals to divert quiescent current flow from said current source section through said means and away from said differential amplifier section to desirably reduce the magnitude of the intermediate signals developed by said amplifier section and the magnitude of the demodulated output signal provided by said synchronous switching section, but having a tendency to reduce the magnitude of the quiescent current supplied from said amplifier section to said synchronous switching section to undesirably reduce the direct voltage developed thereat;*

*said second terminal being coupled, however, to receive said diverted quiescent current for subsequent reinsertion within said synchronous switching section with said reduced magnitude quiescent current from said differential amplifier section in a direction to offset said undesirable reduction in direct voltage and to maintain the total quiescent current in said switching section substantially constant in the presence of such signal magnitude reductions,*

*wherein said second terminal is coupled to reinsert said diverted quiescent current at an output terminal of said synchronous switching section at which the demodulated signals are provided and at which the direct voltage is developed,*

*wherein said synchronous switching section includes a pair of output terminals at which the demodulated signals are provided and at which the direct voltage is developed, and wherein said second terminal is coupled to each of said output terminals by a network serving to connect said output terminals together in response to said externally applied control signal to reduce towards zero the magnitude of the demodulated signal provided by said switching section, and* wherein said means includes a third transistor having an emitter electrode coupled to said current source section, a base electrode coupled to receive said externally applied control signal, and a collector electrode individually coupled to each of said switching section output terminals by a pair of semiconductor rectifiers, and wherein said rectifiers are poled to be forward-biased when said externally applied control signal places said third transistor in a conductive condition.

8. [The improvement of claim 1] *In a synchronous detector including a differential amplifier section formed from two transistors having a pair of base electrodes between which information containing input signals are applied, a pair of collector electrodes at which corresponding intermediate signals are developed for coupling to a synchronous switching section also included within the detector to provide demodulated output signals representative of said information, and a pair of emitter electrodes coupled to a current source section further included within the detector to supply substantially constant quiescent current to said amplifier section and from said amplifier section to said switching section, the improvement comprising:*

*means controllably reducing the magnitude of the demodulated output signal provided by said synchronous switching section without substantially affecting the magnitude of the direct voltage developed thereat, said means including:*

*a. a first terminal coupled to said current source section;*

*b. a second terminal coupled to said synchronous switching section; and*

*c. a third terminal coupled to receive an externally applied signal for controlling the conductivity between said first and second terminals to divert quiescent current flow from said current source section through said means and away from said differential amplifier section to desirably reduce the magnitude of the intermediate signals developed by said amplifier section and the magnitude of the demodulated output signal provided by said synchronous switching section, but having a tendency to reduce the magnitude of the quiescent current supplied from said amplifier section to said synchronous switching section to undesirably reduce the direct voltage developed thereat;*

*said second terminal being coupled, however, to receive said diverted quiescent current for subsequent reinsertion within said synchronous switching section with said reduced magnitude quiescent current from said differential amplifier section in a direction to offset said undesirable reduction in direct voltage and to maintain the total quiescent current in said switching section substantially constant in the presence of such signal magnitude reductions,* wherein said synchronous switching section includes third, fourth, fifth, and sixth transistors, with the emitter electrodes of said third and fourth transistors interconnected with one of said pair of differential amplifier section collector electrodes, with the emitter electrodes of said fifth and sixth transistors interconnected with the other of said pair of differential amplifier section collector electrodes, with the base electrodes of said third and fifth transistors interconnected to receive switching signals for demodulating a first phase of said applied input signals, with the base electrodes of said fourth and sixth transitors interconnected to receive switching signals for demodulating a second phase of said applied input signals, with the collector electrode of said third and sixth transistors interconnected to provide first polarity demodulated signals at a first output terminal of said detector, and with the collector electrodes of said fourth and fifth transistors interconnected to provide second polarity demodulated signals at a second output terminal of said detector, and wherein said means controllably reducing the magnitude of the demodulated output signal without substantially affecting the magnitude of the direct voltage developed at said first and second output terminal includes a seventh transistor having an emitter electrode coupled to said current source section, a base electrode coupled to receive said externally applied control signal, and a collector electrode coupled to one of said [first and second output terminals of said detector or to one of said] interconnected emitter electrodes of said third, fourth, fifth and sixth transistor.

Claims 7 and 9, dependent on amended claims 3 and 8, are determined to be patentable.

* * * * *